(12) United States Patent
Folea, Jr.

(10) Patent No.: US 6,988,229 B1
(45) Date of Patent: Jan. 17, 2006

(54) METHOD AND APPARATUS FOR MONITORING AND CONTROLLING BOUNDARY SCAN ENABLED DEVICES

(76) Inventor: Richard Victor Folea, Jr., 1225 Burgess Dr., Suwanee, GA (US) 30024

( * ) Notice: Subject to any disclaimer, the term of this patent is extended or adjusted under 35 U.S.C. 154(b) by 520 days.

(21) Appl. No.: 10/073,830

(22) Filed: Feb. 11, 2002

(51) Int. Cl.
*G01R 31/28* (2006.01)
*G06F 17/52* (2006.01)

(52) U.S. Cl. .................. 714/727; 703/15; 324/158.1
(58) Field of Classification Search ............... 714/727, 714/724, 726, 729; 324/158.1, 73.1; 716/4, 716/5; 703/13–15, 20, 23
See application file for complete search history.

(56) References Cited

U.S. PATENT DOCUMENTS

| | | |
|---|---|---|
| 4,176,780 A | 12/1979 | Sacher et al. |
| 4,646,299 A | 2/1987 | Schinabeck et al. |
| 5,260,947 A | 11/1993 | Posse |
| 5,261,044 A | 11/1993 | Dev et al. |
| 5,325,309 A | 6/1994 | Halaviati et al. |
| 5,627,842 A | 5/1997 | Brown et al. |
| 5,682,392 A | 10/1997 | Raymond et al. |
| 5,682,489 A | 10/1997 | Harrow et al. |
| 5,751,737 A | 5/1998 | Lagrotta et al. |
| 5,793,366 A | 8/1998 | Mano et al. |
| 5,953,009 A | 9/1999 | Alexander |
| 6,195,774 B1 | 2/2001 | Jacobson |
| 6,279,123 B1 * | 8/2001 | Mulrooney ................. 714/35 |
| 6,389,565 B2 * | 5/2002 | Ryan et al. ................. 714/724 |
| 6,629,282 B1 * | 9/2003 | Sugamori et al. ........... 714/734 |

OTHER PUBLICATIONS

"PATRIOT-A Boundary-Scan Test and Diagnosis System" by Wang et al. Thirty-Seventh IEEE Computer Society International Conference Compcon Spring '92, Digest of Papers Feb. 24-28, 1992 pp. 436-439 Inspec Accession No. 4315153.*
A structured graphical tool for analyzing boundary scan violations Cogswell et al. IBM Corp., Endicott, NY, USA : Test Conference, 2002. Proceedings. International Publication Date: Oct. 7-10, 2002 pages(s): 755-762 Inspec Accession No.:7528844.*
"JTAG Visualizer Makes Boundary Scan Visible Powerful Tool at DFT Assessment and Repair f PCB's" JTAG Technologies Press information release date Nov. 6, 2001.*
Corelis ScanPlus Boundary-Scan and programming system product overview pp. 7-8 1999-2002 Corelis inc.*

* cited by examiner

Primary Examiner—Albert Decady
Assistant Examiner—Cynthia Britt

(57) ABSTRACT

A system for monitoring and controlling boundary scan chains in real time that does not require the use of test vectors or test executives. The system automatically builds virtual Devices Under Test (DUT's) from user provided Boundary Scan Description Language (BSDL) files and displays them on the computer display. The virtual devices are connected to a port on the computer and the scan button is pressed to invoke a boundary scan. The results are displayed as color coded "pins" on a computer display to indicate if the pin is at a logic high, a logic low, or is toggling. Logic values may be forced on the pin via a point-and-click graphical user interface, again bypassing the need for test vectors. Graphical indicators and controls are provided by the system to help simplify monitoring and controlling of the boundary scan chain.

7 Claims, 16 Drawing Sheets

```
static int Reset_Reset[]      = { 1, -1 } ;
static int Reset_Idle[]       = { 0, -1 } ;
static int Reset_SelectDR[]   = { 0, 1, -1 } ;
static int Reset_CaptureDR[]  = { 0, 1, 0, -1 } ;
static int Reset_ShiftDR[]    = { 0, 1, 0, 0, -1 } ;
static int Reset_Exit1DR[]    = { 0, 1, 0, 1, -1 } ;
static int Reset_PauseDR[]    = { 0, 1, 0, 1, 0, -1 } ;
static int Reset_Exit2DR[]    = { 0, 1, 0, 1, 0, 1, -1 } ;
static int Reset_UpdateDR[]   = { 0, 1, 0, 1, 1, -1 } ;
static int Reset_SelectIR[]   = { 0, 1, 1, -1 } ;
static int Reset_CaptureIR[]  = { 0, 1, 1, 0, -1 } ;
static int Reset_ShiftIR[]    = { 0, 1, 1, 0, 0, -1 } ;
static int Reset_Exit1IR[]    = { 0, 1, 1, 0, 1, -1 } ;
static int Reset_PauseIR[]    = { 0, 1, 1, 0, 1, 0, -1 } ;
static int Reset_Exit2IR[]    = { 0, 1, 1, 0, 1, 0, 1, -1 };
static int Reset_UpdateIR[]   = { 0, 1, 1, 0, 1, 1, -1 } ;

static int Idle_Reset[]       = { 1, 1, 1, -1 } ;
static int Idle_Idle[]        = { 0, -1 } ;
static int Idle_SelectDR[]    = { 1, -1 } ;
static int Idle_CaptureDR[]   = { 1, 0, -1 } ;
static int Idle_ShiftDR[]     = { 1, 0, 0, -1 } ;
static int Idle_Exit1DR[]     = { 1, 0, 1, -1 } ;
static int Idle_PauseDR[]     = { 1, 0, 1, 0, -1 } ;
static int Idle_Exit2DR[]     = { 1, 0, 1, 0, 1, -1 } ;
static int Idle_UpdateDR[]    = { 1, 0, 1, 1, -1 } ;
static int Idle_SelectIR[]    = { 1, 1, -1 } ;
static int Idle_CaptureIR[]   = { 1, 1, 0, -1 } ;
static int Idle_ShiftIR[]     = { 1, 1, 0, 0, -1 } ;
static int Idle_Exit1IR[]     = { 1, 1, 0, 1, -1 } ;
static int Idle_PauseIR[]     = { 1, 1, 0, 1, 0, -1 } ;
static int Idle_Exit2IR[]     = { 1, 1, 0, 1, 0, 1, -1 } ;
static int Idle_UpdateIR[]    = { 1, 1, 0, 1, 1, -1 } ;
```

FIG. 8a

```
static int SelectDR_Reset[]      = { 1,  1, -1 } ;
static int SelectDR_Idle[]       = { 0,  1,  1,  0, -1 } ;
static int SelectDR_SelectDR[]   = { 0,  1,  1,  1, -1 } ;
static int SelectDR_CaptureDR[]  = { 0, -1 } ;
static int SelectDR_ShiftDR[]    = { 0,  0, -1 } ;
static int SelectDR_Exit1DR[]    = { 0,  1, -1 } ;
static int SelectDR_PauseDR[]    = { 0,  1,  0, -1 } ;
static int SelectDR_Exit2DR[]    = { 0,  1,  0,  1, -1 } ;
static int SelectDR_UpdateDR[]   = { 0,  1,  1, -1 } ;
static int SelectDR_SelectIR[]   = { 1, -1 } ;
static int SelectDR_CaptureIR[]  = { 1,  0, -1 } ;
static int SelectDR_ShiftIR[]    = { 1,  0,  0, -1 } ;
static int SelectDR_Exit1IR[]    = { 1,  0,  1, -1 } ;
static int SelectDR_PauseIR[]    = { 1,  0,  1,  0, -1 } ;
static int SelectDR_Exit2IR[]    = { 1,  0,  1,  0,  1, -1 } ;
static int SelectDR_UpdateIR[]   = { 1,  0,  1,  1, -1 } ;

static int CaptureDR_Reset[]     = { 1,  1,  1,  1,  1, -1 } ;
static int CaptureDR_Idle[]      = { 1,  1,  0, -1 } ;
static int CaptureDR_SelectDR[]  = { 1,  1,  1, -1 } ;
static int CaptureDR_CaptureDR[] = { 1,  1,  1,  0, -1 } ;
static int CaptureDR_ShiftDR[]   = { 0, -1 } ;
static int CaptureDR_Exit1DR[]   = { 1, -1 } ;
static int CaptureDR_PauseDR[]   = { 1,  0, -1 } ;
static int CaptureDR_Exit2DR[]   = { 1,  0,  1, -1 } ;
static int CaptureDR_UpdateDR[]  = { 1,  1, -1 } ;
static int CaptureDR_SelectIR[]  = { 1,  1,  1,  1, -1 } ;
static int CaptureDR_CaptureIR[] = { 1,  1,  1,  1,  0, -1 } ;
static int CaptureDR_ShiftIR[]   = { 1,  1,  1,  1,  0,  0, -1 } ;
static int CaptureDR_Exit1IR[]   = { 1,  1,  1,  1,  0,  1, -1 } ;
static int CaptureDR_PauseIR[]   = { 1,  1,  1,  1,  0,  1,  0, -1 };
static int CaptureDR_Exit2IR[]   = { 1,  1,  1,  1,  0,  1,  0,  1,-1};
static int CaptureDR_UpdateIR[]  = { 1,  1,  1,  1,  0,  1,  1, -1 };
```

FIG. 8b

```
static int ShiftDR_Reset[]     = { 1, 1, 1, 1, 1, -1 };
static int ShiftDR_Idle[]      = { 1, 1, 0, -1 };
static int ShiftDR_SelectDR[]  = { 1, 1, 1, -1 };
static int ShiftDR_CaptureDR[] = { 1, 1, 1, 0, -1 };
static int ShiftDR_ShiftDR[]   = { 0, -1 };
static int ShiftDR_Exit1DR[]   = { 1, -1 };
static int ShiftDR_PauseDR[]   = { 1, 0, -1 };
static int ShiftDR_Exit2DR[]   = { 1, 0, 1, -1 };
static int ShiftDR_UpdateDR[]  = { 1, 1, -1 };
static int ShiftDR_SelectIR[]  = { 1, 1, 1, 1, -1 };
static int ShiftDR_CaptureIR[] = { 1, 1, 1, 1, 0, -1 };
static int ShiftDR_ShiftIR[]   = { 1, 1, 1, 1, 0, 0, -1 };
static int ShiftDR_Exit1IR[]   = { 1, 1, 1, 1, 0, 1, -1 };
static int ShiftDR_PauseIR[]   = { 1, 1, 1, 1, 0, 1, 0, -1 };
static int ShiftDR_Exit2IR[]   = { 1, 1, 1, 1, 0, 1, 0, 1, -1 };
static int ShiftDR_UpdateIR[]  = { 1, 1, 1, 1, 0, 1, 1, -1 };

static int Exit1DR_Reset[]     = { 1, 1, 1, 1, -1 };
static int Exit1DR_Idle[]      = { 1, 0, -1 };
static int Exit1DR_SelectDR[]  = { 1, 1, -1 };
static int Exit1DR_CaptureDR[] = { 1, 1, 0, -1 };
static int Exit1DR_ShiftDR[]   = { 0, 1, 0, -1 };
static int Exit1DR_Exit1DR[]   = { 0, 1, 0, 1, -1 };
static int Exit1DR_PauseDR[]   = { 0, -1 };
static int Exit1DR_Exit2DR[]   = { 0, 1, -1 };
static int Exit1DR_UpdateDR[]  = { 1, -1 };
static int Exit1DR_SelectIR[]  = { 1, 1, 1, -1 };
static int Exit1DR_CaptureIR[] = { 1, 1, 1, 0, -1 };
static int Exit1DR_ShiftIR[]   = { 1, 1, 1, 0, 0, -1 };
static int Exit1DR_Exit1IR[]   = { 1, 1, 1, 0, 1, -1 };
static int Exit1DR_PauseIR[]   = { 1, 1, 1, 0, 1, 0 };
static int Exit1DR_Exit2IR[]   = { 1, 1, 1, 0, 1, 0, 1, -1 };
static int Exit1DR_UpdateIR[]  = { 1, 1, 1, 0, 1, 1, -1 };
```

FIG. 8c

```
static int PauseDR_Reset[]     = { 1, 1, 1, 1, 1, -1 };
static int PauseDR_Idle[]      = { 1, 1, 0, -1 };
static int PauseDR_SelectDR[]  = { 1, 1, 1, -1 };
static int PauseDR_CaptureDR[] = { 1, 1, 1, 0, -1 };
static int PauseDR_ShiftDR[]   = { 1, 0, -1 };
static int PauseDR_Exit1DR[]   = { 1, 0, 1, -1 };
static int PauseDR_PauseDR[]   = { 0, -1 };
static int PauseDR_Exit2DR[]   = { 1, -1 };
static int PauseDR_UpdateDR[]  = { 1, 1, 1, 0, 1, 1, -1 };
static int PauseDR_SelectIR[]  = { 1, 1, 1, 1, -1 };
static int PauseDR_CaptureIR[] = { 1, 1, 1, 1, 0, -1 };
static int PauseDR_ShiftIR[]   = { 1, 1, 1, 1, 0, 0, -1 };
static int PauseDR_Exit1IR[]   = { 1, 1, 1, 1, 0, 1, -1 };
static int PauseDR_PauseIR[]   = { 1, 1, 1, 1, 0, 1, 0, -1 };
static int PauseDR_Exit2IR[]   = { 1, 1, 1, 1, 0, 1, 0, 1, 1 };
static int PauseDR_UpdateIR[]  = { 1, 1, 1, 1, 0, 1, 1, -1 };

static int Exit2DR_Reset[]     = { 1, 1, 1, 1, -1 };
static int Exit2DR_Idle[]      = { 1, 0, -1 };
static int Exit2DR_SelectDR[]  = { 1, 1, -1 };
static int Exit2DR_CaptureDR[] = { 1, 1, 0, -1 };
static int Exit2DR_ShiftDR[]   = { 0, -1 };
static int Exit2DR_Exit1DR[]   = { 0, 1, -1 };
static int Exit2DR_PauseDR[]   = { 0, 1, 0, -1 };
static int Exit2DR_Exit2DR[]   = { 0, 1, 0, 1, -1 };
static int Exit2DR_UpdateDR[]  = { 1, 0, 1, 1, -1 };
static int Exit2DR_SelectIR[]  = { 1, 1, 1, -1 };
static int Exit2DR_CaptureIR[] = { 1, 1, 1, 0, -1 };
static int Exit2DR_ShiftIR[]   = { 1, 1, 0, 0, -1 };
static int Exit2DR_Exit1IR[]   = { 1, 1, 0, 1, -1 };
static int Exit2DR_PauseIR[]   = { 1, 1, 0, 1, 0, -1 };
static int Exit2DR_Exit2IR[]   = { 1, 1, 0, 1, 0, 1, -1 };
static int Exit2DR_UpdateIR[]  = { 1, 1, 1, 0, 1, 1, -1 };
```

FIG. 8d

```
static int UpdateDR_Reset[]      = { 1,  1,  1, -1 } ;
static int UpdateDR_Idle[]       = { 0, -1 } ;
static int UpdateDR_SelectDR[]   = { 1, -1 } ;
static int UpdateDR_CaptureDR[]  = { 1,  0, -1 } ;
static int UpdateDR_ShiftDR[]    = { 1,  0,  0, -1 } ;
static int UpdateDR_Exit1DR[]    = { 1,  0,  1, -1 } ;
static int UpdateDR_PauseDR[]    = { 1,  0,  1,  0, -1 } ;
static int UpdateDR_Exit2DR[]    = { 1,  0,  1,  0,  1, -1 } ;
static int UpdateDR_UpdateDR[]   = { 1,  0,  1,  1, -1 } ;
static int UpdateDR_SelectIR[]   = { 1,  1, -1 } ;
static int UpdateDR_CaptureIR[]  = { 1,  1,  0, -1 } ;
static int UpdateDR_ShiftIR[]    = { 1,  1,  0,  0, -1 } ;
static int UpdateDR_Exit1IR[]    = { 1,  1,  0,  1, -1 } ;
static int UpdateDR_PauseIR[]    = { 1,  1,  0,  1,  0, -1 } ;
static int UpdateDR_Exit2IR[]    = { 1,  1,  0,  1,  0,  1, -1 } ;
static int UpdateDR_UpdateIR[]   = { 1,  1,  0,  1,  1, -1 } ;

static int SelectIR_Reset[]      = { 1, -1 } ;
static int SelectIR_Idle[]       = { 0,  1,  1,  0, -1 } ;
static int SelectIR_SelectDR[]   = { 0,  1,  1,  1, -1 } ;
static int SelectIR_CaptureDR[]  = { 0,  1,  1,  1,  0, -1 } ;
static int SelectIR_ShiftDR[]    = { 0,  1,  1,  1,  0,  0, -1 } ;
static int SelectIR_Exit1DR[]    = { 0,  1,  1,  1,  0,  1, -1 } ;
static int SelectIR_PauseDR[]    = { 0,  1,  1,  1,  0,  1,  0, -1 } ;
static int SelectIR_Exit2DR[]    = { 0,  1,  1,  1,  0,  1,  0,  1, -1 } ;
static int SelectIR_UpdateDR[]   = { 0,  1,  1,  1,  0,  1,  1, -1 } ;
static int SelectIR_SelectIR[]   = { 0,  1,  1,  1,  1, -1 } ;
static int SelectIR_CaptureIR[]  = { 0,  1,  1,  1,  1,  0, -1 } ;
static int SelectIR_ShiftIR[]    = { 0,  1,  1,  1,  1,  0,  0, -1 } ;
static int SelectIR_Exit1IR[]    = { 0,  1,  1,  1,  1,  0,  1, -1 } ;
static int SelectIR_PauseIR[]    = { 0,  1,  1,  1,  1,  0,  1,  0, -1 } ;
static int SelectIR_Exit2IR[]    = { 0,  1,  1,  1,  1,  0,  1,  0,  1, -1 } ;
static int SelectIR_UpdateIR[]   = { 0,  1,  1,  1,  1,  0,  1,  1, -1 } ;
```

FIG. 8e

```
static int CaptureIR_Reset[]     = { 1,  1,  1,  1,  1, -1 } ;
static int CaptureIR_Idle[]      = { 1,  1,  0, -1 } ;
static int CaptureIR_SelectDR[]  = { 1,  1,  1, -1 } ;
static int CaptureIR_CaptureDR[] = { 1,  1,  1,  0, -1 } ;
static int CaptureIR_ShiftDR[]   = { 1,  1,  1,  0,  0, -1 } ;
static int CaptureIR_Exit1DR[]   = { 1,  1,  1,  0,  1, -1 } ;
static int CaptureIR_PauseDR[]   = { 1,  1,  1,  0,  1,  0, -1 } ;
static int CaptureIR_Exit2DR[]   = { 1,  1,  1,  0,  1,  0,  1, -1 };
static int CaptureIR_UpdateDR[]  = { 1,  1,  1,  0,  1,  1, -1 } ;
static int CaptureIR_SelectIR[]  = { 1,  1,  1,  1, -1 } ;
static int CaptureIR_CaptureIR[] = { 1,  1,  1,  1,  0, -1 } ;
static int CaptureIR_ShiftIR[]   = { 1,  1,  1,  1,  0,  0, -1 } ;
static int CaptureIR_Exit1IR[]   = { 1,  1,  1,  1,  0,  1, -1 } ;
static int CaptureIR_PauseIR[]   = { 1,  1,  1,  1,  0,  1,  0, -1 };
static int CaptureIR_Exit2IR[]   = { 1,  1,  1,  1,  0,  1,  0,  1,-1};
static int CaptureIR_UpdateIR[]  = { 1,  1,  1,  1,  0,  1,  1, -1 };

static int ShiftIR_Reset[]       = { 1,  1,  1,  1,  1, -1 } ;
static int ShiftIR_Idle[]        = { 1,  1,  0, -1 } ;
static int ShiftIR_SelectDR[]    = { 1,  1,  1, -1 } ;
static int ShiftIR_CaptureDR[]   = { 1,  1,  1,  0, -1 } ;
static int ShiftIR_ShiftDR[]     = { 1,  1,  1,  0,  0, -1 } ;
static int ShiftIR_Exit1DR[]     = { 1,  1,  1,  0,  1, -1 } ;
static int ShiftIR_PauseDR[]     = { 1,  1,  1,  0,  1,  0, -1 } ;
static int ShiftIR_Exit2DR[]     = { 1,  1,  1,  0,  1,  0,  1, -1 };
static int ShiftIR_UpdateDR[]    = { 1,  1,  1,  0,  1,  1, -1 } ;
static int ShiftIR_SelectIR[]    = { 1,  1,  1,  1, -1 } ;
static int ShiftIR_CaptureIR[]   = { 1,  1,  1,  1,  0, -1 } ;
static int ShiftIR_ShiftIR[]     = { 0, -1 } ;
static int ShiftIR_Exit1IR[]     = { 1, -1 } ;
static int ShiftIR_PauseIR[]     = { 1,  0, -1 } ;
static int ShiftIR_Exit2IR[]     = { 1,  0,  1, -1 } ;
static int ShiftIR_UpdateIR[]    = { 1,  1,  1,  1,  0,  1,  1, -1 };
```

FIG. 8f

```
static int Exit1IR_Reset[]      = { 1, 1, 1, 1, -1 } ;
static int Exit1IR_Idle[]       = { 1, 0, -1 } ;
static int Exit1IR_SelectDR[]   = { 1, 1, -1 } ;
static int Exit1IR_CaptureDR[]  = { 1, 1, 0, -1 } ;
static int Exit1IR_ShiftDR[]    = { 1, 1, 0, 0, -1 } ;
static int Exit1IR_Exit1DR[]    = { 1, 1, 0, 1, -1 } ;
static int Exit1IR_PauseDR[]    = { 1, 1, 0, 1, 0, -1 } ;
static int Exit1IR_Exit2DR[]    = { 1, 1, 0, 1, 0, 1, -1 } ;
static int Exit1IR_UpdateDR[]   = { 1, 1, 0, 1, 1, -1 } ;
static int Exit1IR_SelectIR[]   = { 1, 1, 1, -1 } ;
static int Exit1IR_CaptureIR[]  = { 1, 1, 1, 0, -1 } ;
static int Exit1IR_ShiftIR[]    = { 0, 1, 0, -1 } ;
static int Exit1IR_Exit1IR[]    = { 0, 1, 0, 1, -1 } ;
static int Exit1IR_PauseIR[]    = { 0, -1 } ;
static int Exit1IR_Exit2IR[]    = { 0, 1, -1 } ;
static int Exit1IR_UpdateIR[]   = { 1, -1 } ;

static int PauseIR_Reset[]      = { 1, 1, 1, 1, 1, -1 } ;
static int PauseIR_Idle[]       = { 1, 1, 0, -1 } ;
static int PauseIR_SelectDR[]   = { 1, 1, 1, -1 } ;
static int PauseIR_CaptureDR[]  = { 1, 1, 1, 0, -1 } ;
static int PauseIR_ShiftDR[]    = { 1, 1, 1, 0, 0, -1 } ;
static int PauseIR_Exit1DR[]    = { 1, 1, 1, 0, 1, -1 } ;
static int PauseIR_PauseDR[]    = { 1, 1, 1, 0, 1, 0, -1 } ;
static int PauseIR_Exit2DR[]    = { 1, 1, 1, 0, 1, 0, 1, -1 };
static int PauseIR_UpdateDR[]   = { 1, 1, 1, 0, 1, 1, -1 } ;
static int PauseIR_SelectIR[]   = { 1, 1, 1, 1, -1 } ;
static int PauseIR_CaptureIR[]  = { 1, 1, 1, 1, 0, -1 } ;
static int PauseIR_ShiftIR[]    = { 1, 0, -1 } ;
static int PauseIR_Exit1IR[]    = { 1, 0, 1, -1 } ;
static int PauseIR_PauseIR[]    = { 0, -1 } ;
static int PauseIR_Exit2IR[]    = { 1, -1 } ;
static int PauseIR_UpdateIR[]   = { 1, 1, -1 } ;
```

FIG. 8g

```
static int Exit2IR_Reset[]       = { 1,  1,  1,  1, -1 } ;
static int Exit2IR_Idle[]        = { 1,  0, -1 } ;
static int Exit2IR_SelectDR[]    = { 1,  1, -1 } ;
static int Exit2IR_CaptureDR[]   = { 1,  1,  0, -1 } ;
static int Exit2IR_ShiftDR[]     = { 1,  1,  0,  0, -1 } ;
static int Exit2IR_Exit1DR[]     = { 1,  1,  0,  1, -1 } ;
static int Exit2IR_PauseDR[]     = { 1,  1,  0,  1,  0, -1 } ;
static int Exit2IR_Exit2DR[]     = { 1,  1,  0,  1,  0,  1, -1 } ;
static int Exit2IR_UpdateDR[]    = { 1,  1,  0,  1,  1, -1 } ;
static int Exit2IR_SelectIR[]    = { 1,  1,  1, -1 } ;
static int Exit2IR_CaptureIR[]   = { 1,  1,  1,  0, -1 } ;
static int Exit2IR_ShiftIR[]     = { 0, -1 } ;
static int Exit2IR_Exit1IR[]     = { 0,  1, -1 } ;
static int Exit2IR_PauseIR[]     = { 0,  1,  0, -1 } ;
static int Exit2IR_Exit2IR[]     = { 0,  1,  0,  1, -1 } ;
static int Exit2IR_UpdateIR[]    = { 1, -1 } ;

static int UpdateIR_Reset[]      = { 1,  1,  1, -1 } ;
static int UpdateIR_Idle[]       = { 0, -1 } ;
static int UpdateIR_SelectDR[]   = { 1, -1 } ;
static int UpdateIR_CaptureDR[]  = { 1,  0, -1 } ;
static int UpdateIR_ShiftDR[]    = { 1,  0,  0, -1 } ;
static int UpdateIR_Exit1DR[]    = { 1,  0,  1, -1 } ;
static int UpdateIR_PauseDR[]    = { 1,  0,  1,  0 } ;
static int UpdateIR_Exit2DR[]    = { 1,  0,  1,  0,  1, -1 } ;
static int UpdateIR_UpdateDR[]   = { 1,  0,  1,  1, -1 } ;
static int UpdateIR_SelectIR[]   = { 1,  1, -1 } ;
static int UpdateIR_CaptureIR[]  = { 1,  1,  0, -1 } ;
static int UpdateIR_ShiftIR[]    = { 1,  1,  0,  0, -1 } ;
static int UpdateIR_Exit1IR[]    = { 1,  1,  0,  1, -1 } ;
static int UpdateIR_PauseIR[]    = { 1,  1,  0,  1,  0, -1 } ;
static int UpdateIR_Exit2IR[]    = { 1,  1,  0,  1,  0,  1, -1 } ;
static int UpdateIR_UpdateIR[]   = { 1,  1,  0,  1,  1, -1 } ;
```

FIG. 8h

METHOD AND APPARATUS FOR MONITORING AND CONTROLLING BOUNDARY SCAN ENABLED DEVICES

CROSS-REFERENCE TO RELATED APPLICATIONS

Not Applicable.

FEDERALLY SPONSORED RESEARCH

Not Applicable.

BACKGROUND OF THE INVENTION

1. Field of Invention

This invention relates generally to the field of testing of integrated circuits and systems, and particularly to boundary scan testing via a machine with an interactive user interface providing real-time monitoring and control of boundary scan enabled devices and systems without requiring the use of test vectors, test executives, netlists, or schematics.

2. Prior Art

Each year electronic circuits and systems get smaller. As a result, the ability to test the smaller circuits with traditional test equipment is becoming more and more of a challenge. In the early 1980's, this issue was recognized and in 1985 a group of electronics and semiconductor manufacturers formed the Joint Test and Access Group (JTAG) to develop a standard for building testability features into the semiconductor devices. The standard was adopted in February 1990 as "IEEE 1149.1-1990, IEEE Standard Test Access Port and Boundary Scan Architecture." This standard is focused on providing test methodology to identify manufacturing defects such as soldering errors, missing components, broken wire bonds, and bad part orientation.

IEEE 1149.1 is now commonly used by the manufacturing community to test for defects and several tools are available that provide excellent test coverage of electronic assemblies. Unfortunately, even though the standard has been in place for over 10 years, design engineers and the electronics design community in general have not adopted boundary scan testing. This is due to a lack of tools that are inexpensive and easy to learn and use with little or no prior understanding of boundary scan. Without readily available easy-to-use boundary scan tools, engineers have to resort to crude trial-and-error test methodology which is expensive and time-consuming.

Boundary scan tools available today typically cost anywhere from $10,000 for bare-bones tools to more than $50,000 for full-featured tools. These costs are prohibitive for an average design engineer that simply wants to know if a part is soldered to a board correctly.

Further, while the tools that are available today are very powerful, unfortunately they are also very complicated and difficult to learn and use. First a schematic netlist must be run through an Automatic Test Pattern Generator (ATPG) to generate test vectors and a test executive must be created to setup the Boundary Scan operations. The test executive then runs the test patterns through all of the devices and produces a static report that identifies potential errors. These tools have a steep learning curve and require a fundamental understanding of boundary scan that most design engineers do not have today. Additionally, in order to cover as much of the circuitry on a board as possible, including components that are not boundary scan enabled, test points and probes must be added to the circuitry to provide the scan tools access to those otherwise inaccessible components. This creates additional cost and complications.

Traditional boundary scan tools produce a static output report that does not lend itself to simple interactive debugging of the integrated circuits under test.

OBJECTS AND ADVANTAGES

Accordingly, besides the objects and advantages of the system described above, several objects and advantages of the present invention are:

(a) to provide an improved system to aid in performing boundary scan operations on electronic circuits;

(b) to provide an interactive computer machine that provides a graphical display useful in interpreting the boundary scan results in a manner that is familiar to a wide audience including electronics design engineers, electronic test engineers and technicians, and manufacturing engineers and technicians;

(c) to provide a method of performing boundary scan testing without requiring the use of test vectors, test executives;

(d) to provide indicators and controls that help further simplify the monitoring and control of electronics circuits via boundary scan testing;

(e) to automatically build virtual DUTs from vendor provided Boundary Scan Description Language (BSDL) files for display, which eliminates the need to maintain parts libraries;

(f) to provide a machine and method for boundary scan operations that requires little or no knowledge of the intricacies of the boundary scan standard, thereby reducing the learning curve and making boundary scan more available to the design community;

(g) to provide an inexpensive means of performing boundary scan operations; and (h) to provide a simple, effective means to manually debug circuitry using boundary scan.

SUMMARY

The present invention overcomes the above noted issues of the prior art by providing a method and apparatus that does not require the use of test vectors, test executives, netlists, or schematics to run boundary scan operations, uses a simple Light Emitting Diode (LED) and pushbutton switch graphical interface that the design community is already comfortable and familiar with, provides boundary scan cell results in real time, and is inexpensive to manufacture and produce.

The tester works by providing a graphical pushbutton and LED user interface that is already familiar to the user. The interface provides the following simple three-step process for invoking boundary scan operations on a circuit under test: 1) place virtual components on the display, 2) connect the components to a port on the computer, and 3) press a control or "button" to invoke scanning. This three-step process requires only minutes to learn as opposed to days or weeks required by traditional tools and does not require the use of ATPG (Automatic Test Pattern Generators), test vectors, test executives, netlists, or schematics. The interface shows the results in the form of virtual Devices Under Test (DUTs) on a display in which each pin on each device in the scan chain displays real-time status in the form of color-coded responses. A logic high may be represented as RED and a logic low may be represented as BLACK, for example.

A pin that is toggling between a logic high and a logic low is displayed as flickering between two colors. This generates the appearance of lights blinking to indicate pin activity. At a glance, the user can see in real-time if a pin or a logic cell on a part is active which in turn tells the user if the part is attached to the circuit assembly correctly. The interface also provides the user with the ability to interactively force any JTAG enabled pin to a given state via a graphical point and click interface. The present tester requires only a computer device and a simple cable, thereby eliminating the expensive additional hardware required by traditional scan tools. This tester does not replace prior-art, but rather augments it to provide users with a simple, manual method to control and monitor a boundary scan chain in real-time.

DRAWINGS—FIGURES

FIGS. 8a to 8h shows an example of predetermined state transitions which in turn removes the need for a user to provide a test executive.

DETAILED DESCRIPTION—PREFERRED EMBODIMENT

Detailed descriptions of the preferred embodiments are described in the following paragraphs.

FIG. 1

Figure 1:
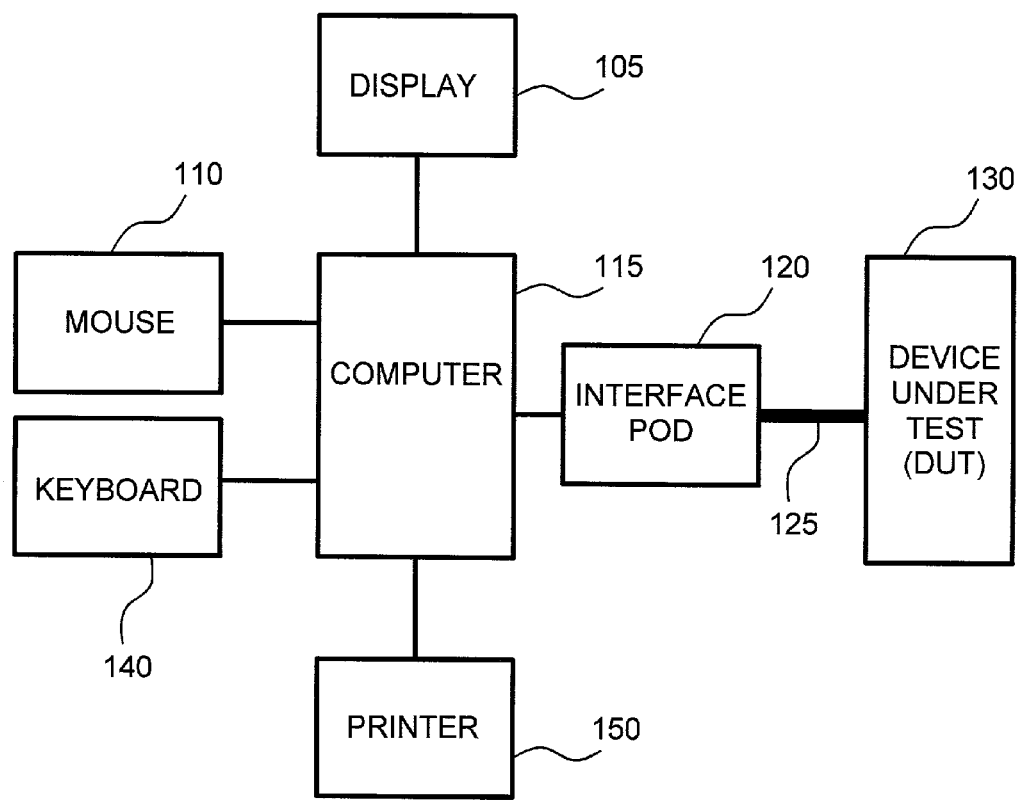
FIG. 1 is a schematic diagram of a testing machine which implements the present invention.

FIG. 1 shows a test apparatus for carrying out the preferred embodiment of the invention. A computer 115 of the traditional type including RAM, ROM, processor, etc. is shown operatively connected by wires to a display 105, keyboard 140, mouse 110, printer 150 and interface pod 120 with interface cable 125 making the required IEEE 1149.1 boundary scan connections to the device under test (DUT) 130 through a variety of connection means. Interface pod 120 provides electrical conversion between the computer and the devices under test. Some examples are to provide electrical conversion between the Parallel port, USB port or serial port on the computer to the devices under test. The processor operates to control the program within computer 115, and receive and store data from the input devices and transmit data to the output devices. Notebook computers of similar configuration can be used as well.

FIG. 2

Figure 2:
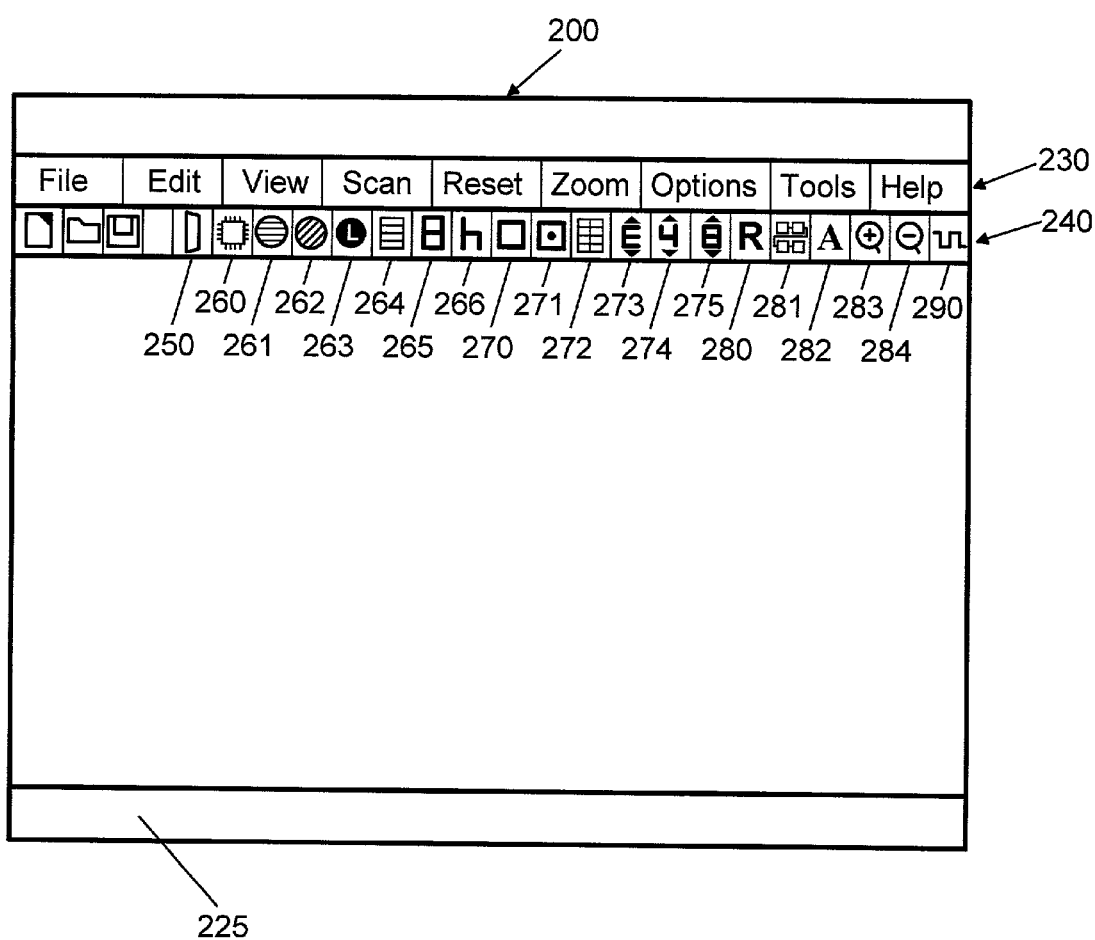
FIG. 2 illustrates a graphical user interface according to the present invention before virtual devices, ports, controls and indicators are added.

Upon initiating the program, which may take place in a variety of ways such as clicking on an icon on the graphical user interface or typing a sequence of characters on a command line, computer 115 causes display 105 to show a screen 200 substantially as shown in FIG. 2. FIG. 2 presents a control panel where the user can set up, run, and control the boundary scan operations via a menu bar 230 or a tool bar 240. Toolbar 240 includes buttons such as ADD PORT Button 250, ADD DEVICE Button 260, buttons to add various indicators, such as ADD POWER Button 261, ADD SINGLE LED Button 262, ADD LATCHING LED Button 263, ADD BAR GRAPH LED Button 264, ADD 7-SEGMENT LED Button 265, ADD HEXADECIMAL LED Button 266 and buttons to add various controls, such as ADD TOGGLE SWITCH Button 270, ADD MOMENTARY SWITCH Button, 271, ADD DIP SWITCH Button 272, ADD 4-BIT THUMBWHEEL SWITCH Button 273, ADD 7-SEGMENT DECIMAL SWITCH Button 274, ADD 7-SEGMENT THUMBWHEEL SWITCH Button 275, and miscellaneous buttons such as RESET SCAN CHAIN Button 280, REFRESH DISPLAY Button 281, ADD STATIC TEXT Button 282, ZOOM-IN Button 283, ZOOM-OUT Button 284 and a START/STOP SCAN OPERATIONS Button 290. The selection of buttons may be of a variety of selection means. The buttons shown in FIG. 2 represent the preferred embodiment.

Menu bar 230 provides an alternate means of accessing the same functions as tool bar 240 and is shown as the preferred commercial embodiment for system. Upon selecting ADD DEVICE Button 260 preferably by positioning a cursor over the button and clicking with a mouse button or selecting and depressing the Enter key on the keyboard, the user is prompted to select a Boundary Scan Description Language (BSDL) file for an intended target device. The BSDL file, which is provided by the vendor of the device under test and is not part of the invention, describes the characteristics of the scan chain and includes information on how to access and control those characteristics per the IEEE 1149.1 standard.

Status Line 225 is provided that displays configuration and status information about devices, pins, indicators and controls. If the cursor is placed over a device pin, the status line shows the Pin Number, Pin Name, Net Name, and which scan cell is being viewed. If the cursor is placed over a device, then the status line displays the device name and mode (EXTEST, SAMPLE/PRELOAD, BYPASS, etc). If the cursor is placed over an indicator or control, the status line shows the Device the indicator is connected to, the pin number it is connected to, the net name of the pin it is connected to, and the BSDL name assigned to the pin.

FIG. 3

Figure 3:
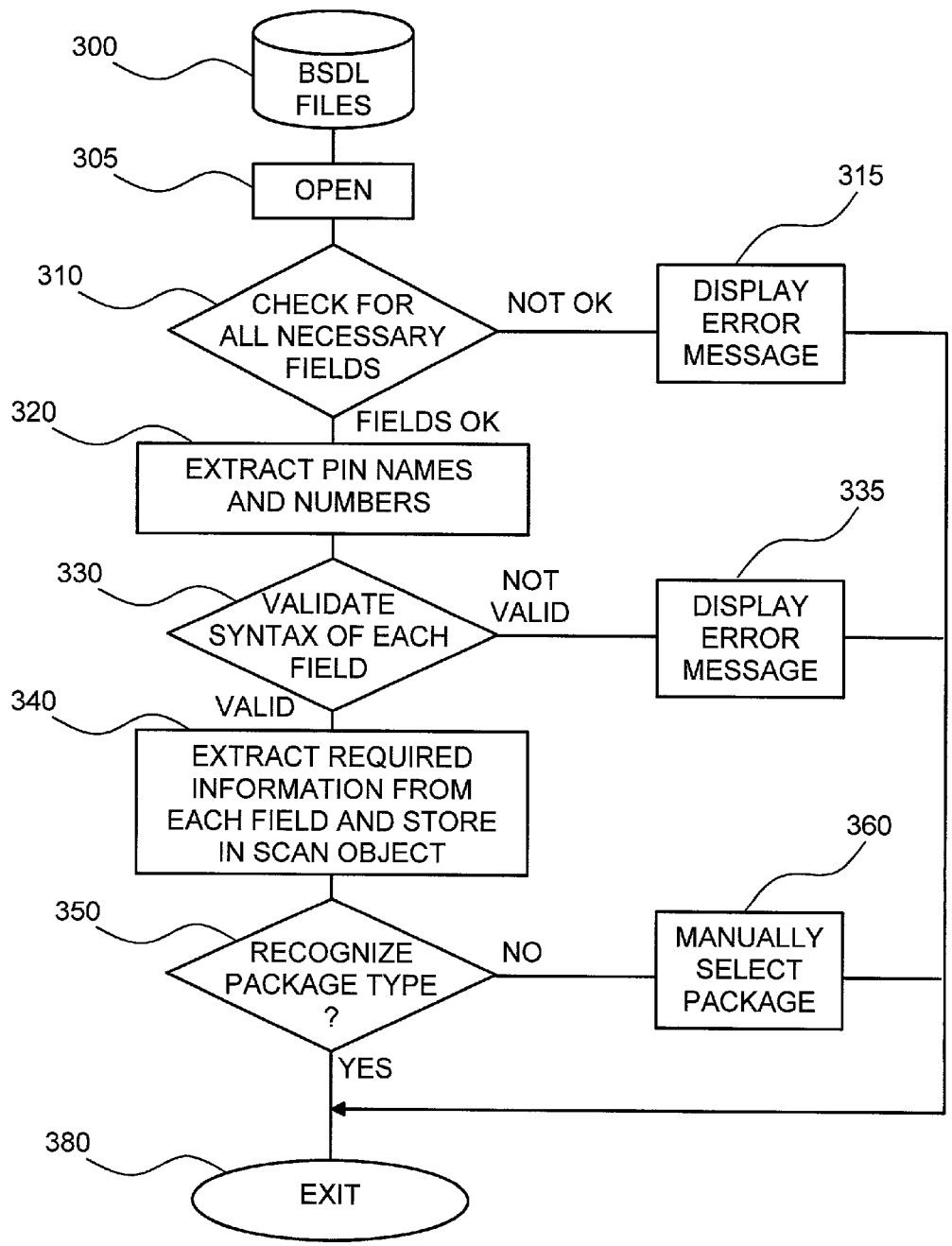
FIG. 3 illustrates the process of building a virtual device under test from user-provided Boundary Scan Description Language (BSDL) files.

The BSDL file is parsed as shown in FIG. 3. A BSDL file 300 is read in by block 305 and checked to make sure it has all of the required fields at block 310. If there is a field missing then an error message is displayed by block 315 and the routine is exited at element 380 so the user can try a different BSDL file. Pin names and pin numbers are then extracted from CONSTANT field of the BSDL file in block 320 and stored in memory. Each of the required fields in block 310 is validated for proper syntax in block 330. If any fail, an error message is displayed by block 335 and the routine is exited at block 380 so the user can try a different BSDL file. All of the information required is then extracted at block 340 and stored in memory. If the program does not recognize the package type in block 350 then the user is asked to provide the package type by block 360.

FIG. 4

Figure 4:
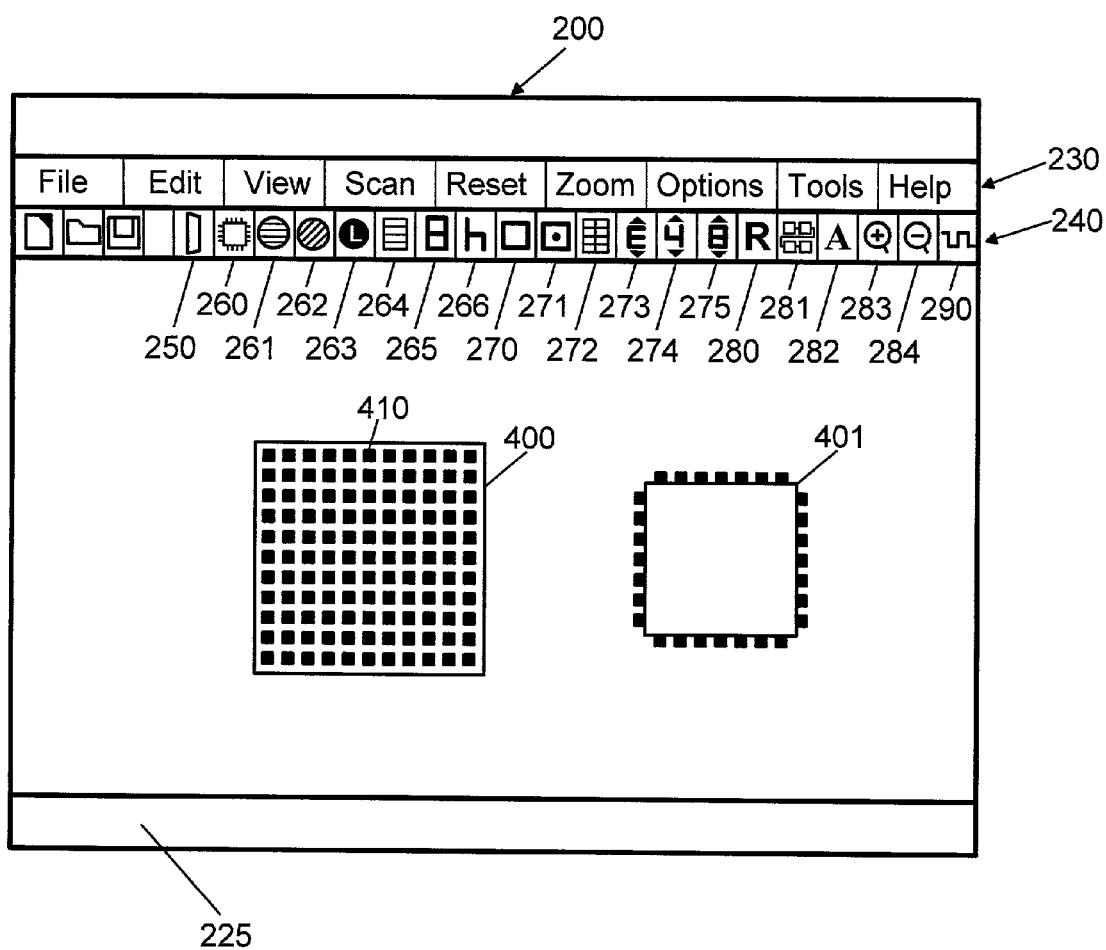
FIG. 4 illustrates the graphical user interface with virtual devices under test added and shows two possible configurations of the virtual pins used in conjunction with the virtual devices under test.

The BSDL file information extracted by the process shown in FIG. 3 is used by the tester to build a Virtual Device Under Test (VDUT) to be placed on display 105. An example of two such VDUTs (400, 401) is shown in FIG. 4. In the preferred embodiment, each part is shown as an abstraction that resembles the physical device under test. In the example shown in FIG. 4 each part has a package body and a view of all pins 410 identified in the BSDL file. This provides a virtual counterpart to the real device under test to help simplify the interpretation of boundary scan results by providing a one-to one relationship between a real device and a virtual device.

ADD DEVICE button 260 may be used anytime a scan is not in process and virtual devices may be inserted anywhere in the chain. Virtual devices may be deleted from a chain anytime a scan is not running. Any number of VDUTs can be added to the chain with the only limitation being the physical memory size of the host computer.

FIG. 5

Figure 5:
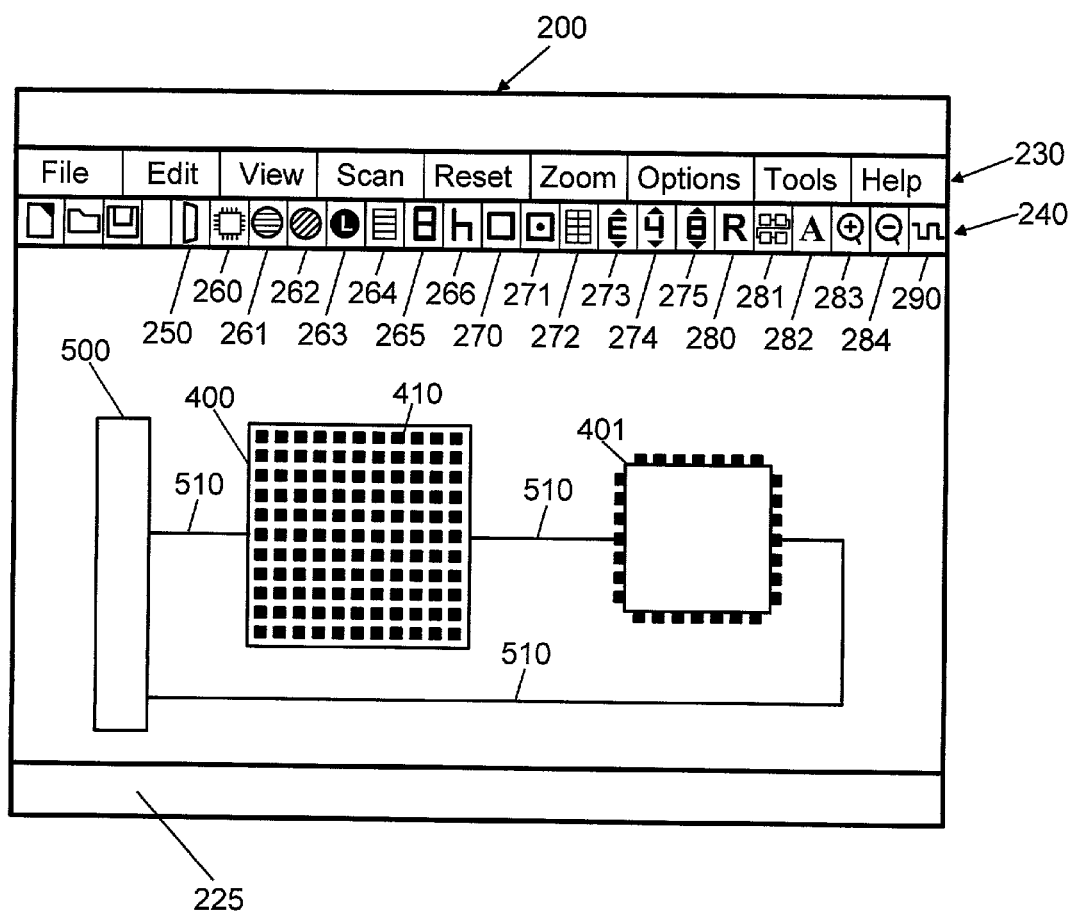
FIG. 5 illustrates the graphical user interface with virtual devices under test.

Upon Pressing the ADD PORT Button 250 the system automatically connects all devices in the chain to a parallel port of the computer, displays lines representing connection 510 of any devices added and displays an icon representing I/O port 500 as shown in FIG. 5. If more than one port is found, then the user is asked to select a port to connect to. Port 500 may be added either before or after the devices are added. The port and at least one device must be present before boundary scan operations can begin.

Upon pressing START/STOP SCAN OPERATIONS Button 290 the system issues a boundary scan RESET command per IEEE Standard 1149.1 to the chain and then begins a periodic scan of the components in the mode selected by the user. If in SAMPLE/PRELOAD mode, the pin states are periodically captured, shifted out and displays the data in the form of color coded pin states on the display. In the preferred embodiment the color-coding is user selectable with the default coding being RED for logic high and BLACK for logic low. A separate color code is provided for each of the three cells typically provided for each pin in the IEEE 1149.1 standard. If upon pressing SCAN button 290 the device mode is EXTEST (as defined in IEEE 1149.1) then the system responds in one of three user selected ways: 1) the system reads the status of any predefined controls that may be present and applies them to the input buffer of the scan chain. All other pins are set to the default specified in the BSDL file, 2) the system reads the status of any predefined controls that may be present and applies them to the input buffer of the scan chain. All other pins are set to the state they were in when EXTEST was invoked, 3) All pins are Tri-stated or placed in a safe state.

FIG. 6

Figure 6:
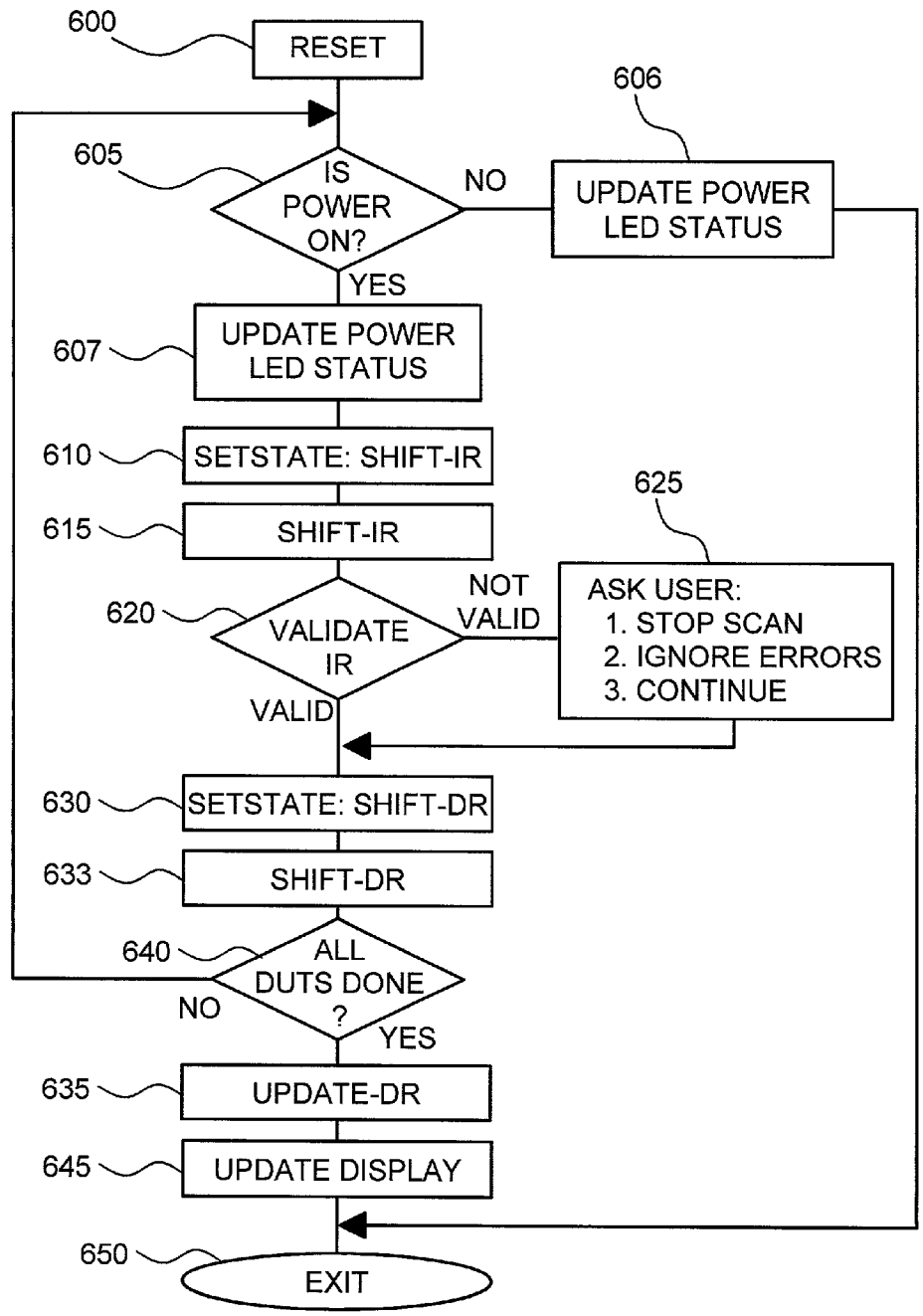
FIG. 6 is a flowchart of the boundary scan operation that allows the user to do boundary scan operations without the need to prepare test executives or test vectors.

The scan operation performed is shown in FIG. 6. The scan chain is initialized by issuing a RESET command in block 600 per IEEE1149.1. The status of the circuit under test power supply is assessed in block 605 and an appropriate warning is issued if the power is not detected in block 606. If power is detected then the power indicator is updated if the user added it to the display.

The boundary scan chain is commanded into the IEEE 1149.1 SHIFT_IR State in block 610 and the instruction is shifted into the instruction register in block 615. Data shifted out of the instruction register is validated in accordance with IEEE 1149.1 standard in block 620 and an error message is displayed if the result is not correct in block 625. The user is offered three options in block 625: to continue scanning, to ignore the errors, or to stop scanning.

The scan chain is next placed into SHIFT_DR in block 630 per the IEEE 1149.1 standard and the TDI input buffer is shifted into the boundary scan chain while the TDO buffer collects results exiting the scan chain in block 633.

The above process is repeated for each device in the scan chain by block 640. Once all of the device data has been shifted in, the data registers are updated in block 635 and this single scan operation is complete at block 650 and ready for the next periodic scan.

FIGS. 7 & 8

Figure 7:
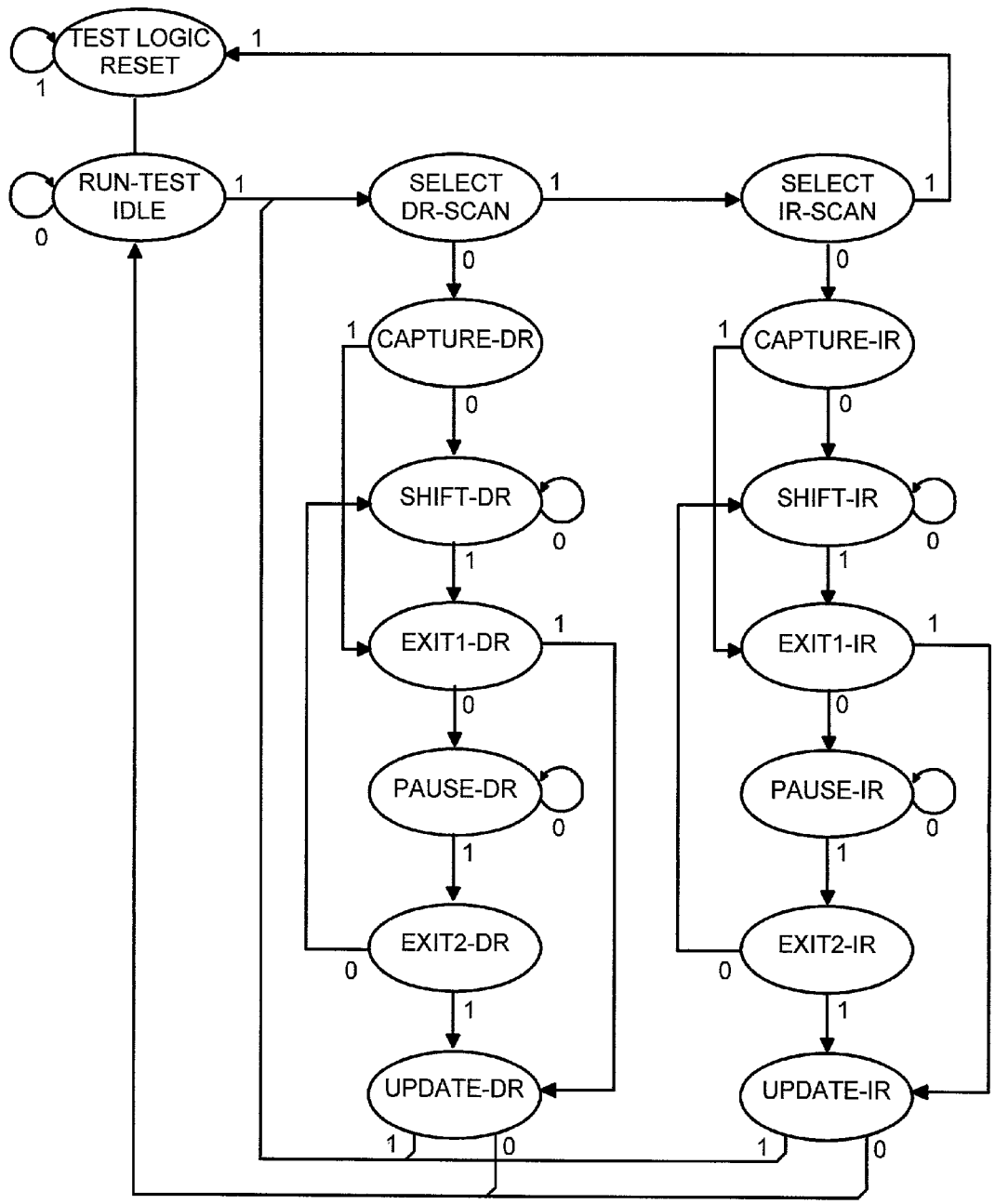
FIG. 7 is a flowchart showing the various states of a state machine associated with the boundary scan architecture.

A predetermined table look up scheme is used to determine how to get to the next state in the IEEE 1149.1 defined Test Access Port (TAP) controller shown for reference in Prior-art FIG. 7. Prior-art FIG. 7 shows all states and transitions possible in the TAP controller. The sequence of steps required to transition from a given state to any other state in FIG. 7 is detailed in FIG. 8 as a predetermined look-up table. This allows transitions through the IEEE1149.1 defined TAP controller state diagram to be accomplished with a single "Set State" command and allows the user to run boundary scan operations without any detailed knowledge of the intricacies of IEEE 1149.1. Since there are 16 possible states in the diagram, and each state can be approached from any other state, there are 256 possible state transitions and therefore 256 table entries. Each table entry contains a pointer to an array of predefined state transitions. In the preferred embodiment each entry in the table should represent the shortest possible path between any two states.

FIG. 9

Figure 9:
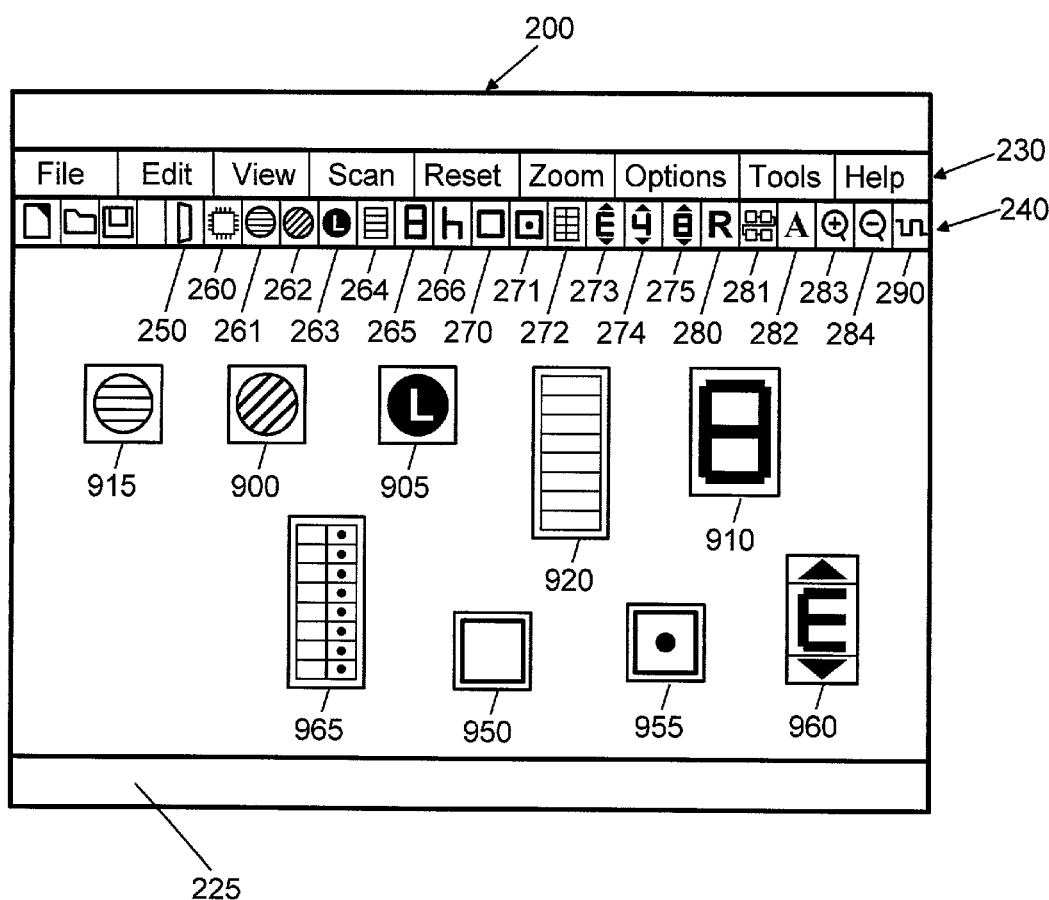
FIG. 9 illustrates the graphical user interface with examples of possible virtual indicators and controls.

Indicators are provided to help simplify the monitoring of device pin activity. A variety of indicators can be selected and configured to represent the activity seen by a user specified boundary scan cell. Several indicators provided are shown in FIG-9. These include the single indicator 900, the latched version of the single indicator 905, the hexadecimal display 910, a power indicator 915 and a bargraph indicator 920. These indicators are intended to represent several indicators that can be used and are not intended to limit the possible use of other indicators.

Controls are provided to help simplify the process of forcing values onto device pins while in EXTEST mode. Several controls are shown in FIG-9. These include a Toggle Switch Control 950, a Momentary Switch Control 955, a Thumbwheel Switch Control 960, and a DIP Switch Control 965. Each control is designed to present the user with an entity that is already familiar to the user and does not require new or unique knowledge to operate. These controls are intended to represent several controls that can be used and are not intended to limit the possible use of other controls.

Right clicking on an item accesses the properties of a device, indicator, port or control. Device properties the user can view and or modify include: Device name, Pin Information extracted from the BSDL file, Setting of global pin colors, setting of global cell view, any design warnings found in the BSDL file, and a BSDL file viewer.

CONCLUSION, RAMIFICATION, AND SCOPE

Accordingly, the reader will see that the boundary scan machine can be used to interactively control and monitor boundary scan enabled devices and circuits in real time via a simple, graphical LED and pushbutton user interface. Furthermore, the machine has the additional advantages in that:

- It does not require the use of test vectors, thus saving the user cost of purchasing test vector generation tools and the time required to set up, learn, and use them.
- It does not require the user to explicitly state/configure/define the IEEE 1149.1 states the TAP controller must transition through—this is all done automatically and is completely transparent to the user.
- It does not require that user compile or otherwise create test setups or test executives which saves the user time and eliminates the need for traditional test executives which are complicated and difficult to use.
- It provides a simple three step process to run boundary scan operations that can be mastered in minutes; traditional tools require several days or weeks to learn.
- It provides virtual indicators for monitoring pin activity that are already familiar to the user, thereby simplifying the learning curve and lowering apprehension about learning how to use boundary scan
- It provides virtual controls for controlling pin/scan cell activity that are familiar to the user, thereby simplifying the learning curve and lowering apprehension about learning how to use boundary scan.
- It does not require the use of any special high speed hardware—a computer parallel port and a simple cable is adequate, thereby making the machine inexpensive to manufacture and sell.
- It is extremely portable and can be used with a laptop style computer.
- It creates Virtual DUT's on the fly from user provided BSDL files, thereby eliminating the need for obtaining and maintaining component libraries.
- It provides ready access to DUT information via device properties dialogs.
- It provides a means of running boundary scan operations that does not require the use of net lists or schematics
- It provides multiple zoom levels for micro or macroscopic viewing of pin information
- It provides color coding of all pins, indicators, and controls to help simplify the organization of the information being monitored and/or controlled
- It provides the ability to hide the scan chain, the indicators, and switches to help simplify the display and present a clean control panel to the user
- It can be used to monitor and control systems as well as discrete devices; any system that is controlled by boundary scan enabled devices can be controlled and monitored via this invention.

Although the description above contains many specificities, these should not be construed as limiting the scope of the invention but as merely providing illustrations of some of the presently preferred embodiments of this machine. For example, the user interface can appear differently and maintain the same functionality. The interface can be adapted to various operating systems that may have a different mechanism of accessing file information; indicator, control, port and devices can be colored differently or made to appear in different shapes and sizes; the interface can be changed to monitor or control a system level view instead of a device level view, etc. Information may be added to the status line without affecting the scope of the present invention. The use of the parallel port for boundary scan operations is preferred but is not intended to preclude the use of other ports (USB, firewire, etc) in future embodiments of the present invention. Package boundaries may not be needed or not need to bear a physical resemblance to a physical device under test.

It is anticipated that the preferred embodiment of the system will used with the Windows™ operating systems run on an Intel™ Pentium™ processor, though modifications to particular operating systems and processors would be evident and not beyond the invention.

Thus the scope of the invention should be determined by the appended claims and their legal equivalents, rather than by the examples given.

I claim:

1. A method for monitoring and controlling, from a host computer, the real-time logic state of a plurality of target devices in a boundary scan chain, comprising:
   (a) displaying graphical representations of said target devices on a graphical display device connected to said host computer,
   (b) running boundary scan operations on said target devices to collect information about said target devices and storing said information in said host computer for said displaying of graphical representation,
   (c) updating said graphical representations with said information to visually indicate a current real-time logic state of said target devices,
   (d) initiating and running boundary scan operations via a method that frees the user from generating, preparing, or otherwise creating test vectors,
   (e) initiating and running boundary scan operations via a method that frees the user from supplying test executives, and
   (f) whereby a human can view and manipulate a boundary scan enabled device via a graphical user interface.

2. The method of claim 1 further comprising modifying the attributes of said graphical representations to help organize and simplify monitoring of said boundary scan chain.

3. The method of claim 1, further comprising providing a plurality of virtual indicators to augment and simplify the display of boundary scan information.

4. The method of claim 3 wherein said indicators are graphical representations of light emitting diodes.

5. The method of claim 1, further comprising providing a plurality of virtual controls to augment and simplify the control of data in a boundary scan chain.

6. The method of claim 5 wherein said indicators appear as graphical representations of mechanical switches.

7. The method of claim 1, further comprising providing a graphical representation of an input-output port on said host computer used to perform boundary scan operations, whereby said input-output port graphical representation serves to visually remind the user which port is controlling the scan chain.

* * * * *